(12) United States Patent
Park et al.

(10) Patent No.: US 8,431,930 B2
(45) Date of Patent: Apr. 30, 2013

(54) DISPLAY DEVICE

(75) Inventors: Chan-Young Park, Yongin (KR);
Beom-Shik Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 183 days.

(21) Appl. No.: 12/980,180

(22) Filed: Dec. 28, 2010

(65) Prior Publication Data

US 2011/0163318 A1  Jul. 7, 2011

(30) Foreign Application Priority Data

Jan. 4, 2010 (KR) ........................ 10-2010-0000207

(51) Int. Cl.
*H01L 29/04* (2006.01)
*H01L 31/036* (2006.01)
(52) U.S. Cl.
USPC .............................................. 257/59; 257/72
(58) Field of Classification Search .............. 257/59–72,
257/E51.018, E29.273
See application file for complete search history.

(56) References Cited

U.S. PATENT DOCUMENTS

| 6,046,849 A | 4/2000 | Moseley et al. |
| 7,560,316 B2 * | 7/2009 | Heo et al. ........................ 257/89 |
| 7,993,804 B2 * | 8/2011 | Hamawaki et al. ............... 430/7 |
| 2008/0211998 A1 | 9/2008 | Liu et al. |
| 2011/0012816 A1 * | 1/2011 | Kang et al. ...................... 345/76 |

FOREIGN PATENT DOCUMENTS

| JP | 2007-115529 | 5/2007 |
| JP | 2008-135333 | 6/2008 |
| KR | 10-2001-0081249 | 8/2001 |
| KR | 10-2007-0007606 | 1/2007 |

* cited by examiner

*Primary Examiner* — Cuong Q Nguyen
(74) *Attorney, Agent, or Firm* — Christie, Parker & Hale, LLP

(57) ABSTRACT

A display device includes: i) a substrate member having a transparent area and a plurality of pixel areas, the pixel areas being spaced apart from each other along a first direction and a second direction, the transparent area located between the pixel areas, the second direction being perpendicular to the first direction; and ii) an emission layer located at each of the pixel areas. Among the plurality of pixel areas, a width of the transparent area along the first direction between two pixel areas varies along the second direction. The first direction may be the horizontal direction of a screen realized by the substrate member, the second direction may be a vertical direction, and the emission layer may have a width along the horizontal direction that varies along the vertical direction.

19 Claims, 15 Drawing Sheets

DISPLAY DEVICE

CROSS-REFERENCE TO RELATED APPLICATIONS

This application claims priority to and the benefit of Korean Patent Application No. 10-2010-0000207 filed in the Korean Intellectual Property Office on Jan. 4, 2010, the entire content of which is incorporated herein by reference.

BACKGROUND

1. Field

An aspect of embodiments according to the present invention relates generally to a display device.

2. Description of the Related Art

An organic light emitting diode (OLED) display and a field emission display are self-emission display devices, and a transparent display device can be manufactured using the self-emission display device. In further detail, in the self-emission display device, a user can view an image of an object located at the opposite side (i.e., the opposite side of the user with respect to the display device) of the display device when a plurality of pixel areas is formed at a distance from each other with a transparent area between the pixel areas.

That is, when the pixel areas are in the switch-off state, light of the object located at the opposite side of the display device passes through the transparent area of the display device so that the user can view the image. In addition, when the plurality of the pixel areas are in the switch-on state, the pixel areas emit light so that an image (e.g., a predetermined image) can be displayed, and, simultaneously, the image of the object at the opposite side can be viewed.

However, since the transparent areas are repeatedly arranged with a constant gap therebetween in the display device, the transparent area optically functions as a multi-slit. The multi-slit causes diffraction interference of light passing therethrough so that an image of an object located at the opposite side of the display is distorted to multiple images. Thus, multiple-image distortion occurs when the pixel areas are in the switch-off state, and the image distortion deteriorates the quality of the screen realized by the display device when the pixel areas are in the switch-on state.

The above information disclosed in this Background section is only for enhancement of understanding of the background of the described technology, and therefore it may contain information that does not form the prior art that is already known in this country to a person of ordinary skill in the art.

SUMMARY

The described embodiments of the present invention are directed toward a display device that may prevent multiple image distortion by suppressing diffraction interference of light when pixel areas are in the switch-off state and improve screen quality when the pixel areas are in the switch-on state.

A display device according to an exemplary embodiment includes: i) a substrate member having a transparent area and a plurality of pixel areas, the pixel areas being spaced apart from each other along a first direction and a second direction, the transparent area being located between the pixel areas, the second direction being perpendicular to the first direction; and ii) an emission layer located at each of the pixel areas. A width of the transparent area along the first direction between two pixel areas among the pixel areas varies along the second direction.

The first direction may be a horizontal direction of a screen realized by the substrate member, and the second direction may be a vertical direction of the screen. The width of the emission layer measured along the horizontal direction may vary along the vertical direction.

The emission layer may include a pair of long sides in parallel with the vertical direction, and the pair of long sides may include recess portions that are spaced apart from each other and convex portions between the recess portions. The recess portions and the convex portions may have one of a semi-circle shape or a rectangular shape.

The recess portions may have a same shape and size, the convex portions may have a same shape and size, and the pair of long sides may be symmetrical with respect to an axis extending in the second direction.

Two adjacent emission layers in the horizontal direction may be offset from each other by an offset distance in the vertical direction.

The offset distance between the two adjacent emission layers may be different from a maximum width of the recess portions or the convex portions.

At least two of the recess portions may be different from the other recess portions in shape and size, and at least two of the convex portions may be different from the other convex portions in shape and size.

The emission layer may be an organic emission layer. The display device may further include a hole injection electrode at one side of the organic emission layer and an electron injection electrode at the other side of the organic emission layer.

The hole injection electrode may be a pixel electrode including a reflective conducting material, and the electron injection electrode may be a common electrode including a semi-transparent conducting material The pixel electrode and the organic emission layer may have a same shape.

The display device may further include a thin film transistor and a capacitor at the pixel area, the thin film transistor being electrically coupled with the hole injection electrode or the electron injection electrode. The thin film transistor may include a gate electrode, a source electrode, and a drain electrode, each of said electrodes including a transparent or semi-transparent conducting material.

The display device may further include a buffer layer, an insulation layer, a planarization layer, and a pixel defining layer each including a transparent or semi-transparent insulating material and being formed on the substrate member.

The substrate member may include a first substrate and a second substrate with a vacuum area therebetween, and the emission layer includes a phosphor layer formed on the second substrate.

The display device may further include a cathode and a gate electrode crossing each other on the first substrate, an insulation layer between the cathode and the gate electrode, an electron emission region electrically coupled to the cathode, and an anode on the second substrate.

The cathode and the gate electrode may cross each other at the pixel area, and the electron emission region may be located on the cathode at the pixel area. The cathode and the gate electrode may include a transparent or semi-transparent conducting material, and the insulation layer may include a transparent or semi-transparent insulating material.

According to the exemplary embodiments, diffraction interference of light passing through the display device can be suppressed by weakening or substantially eliminating periodicity of the width of the transparent area. Therefore, image distortion due to multiple images can be prevented when the pixel areas are in the switch-off state and quality of the screen realized by the display device can be improved when the pixel areas are in the switch-on state.

DETAILED DESCRIPTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

It will be understood that when an element such as a layer, film, region, or substrate is referred to as being "on" another element, it can be directly on the other element or intervening elements may also be present. By contrast, it will be understood that when an element is referred to as being "directly on" another element, intervening elements are not present.

Figure 1:
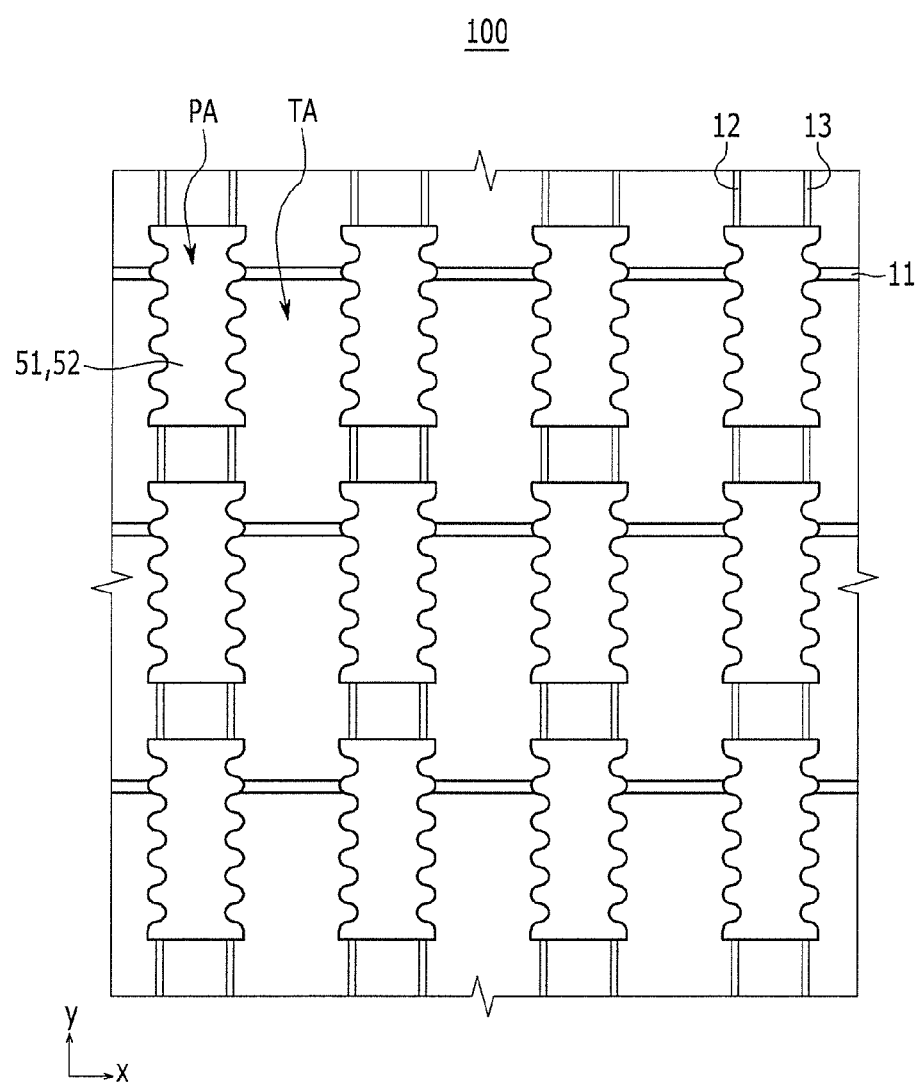
FIG. 1 is a plan view of a layout of a display device according to a first exemplary embodiment.
Figure 2:
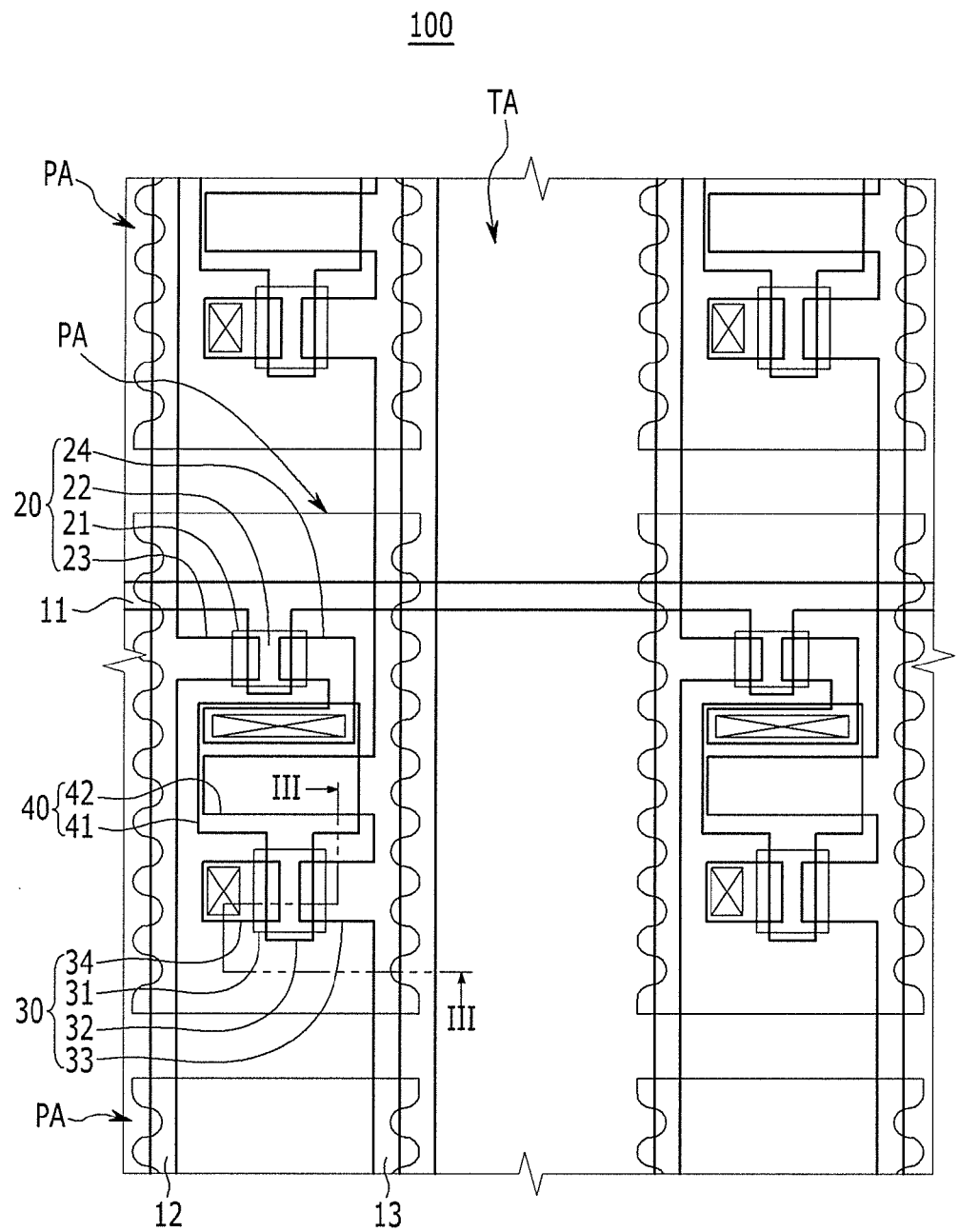
FIG. 2 is an enlarged plan view of a portion of the display device of FIG. 1.
Figure 3:
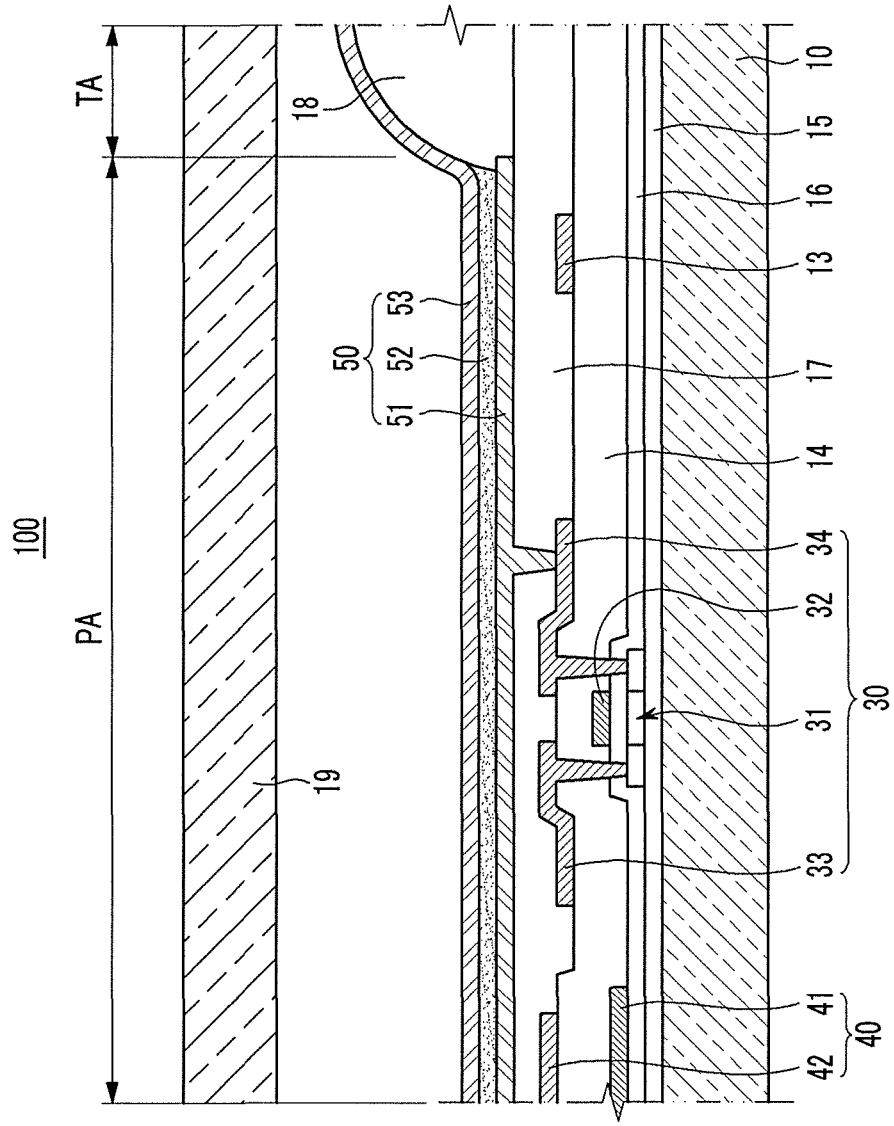
FIG. 3 is a cross-sectional view of FIG. 2, taken along the line III-III.

FIG. 1 is a plan view of a layout of a display device according to a first exemplary embodiment, FIG. 2 is an enlarged plan view of a portion of FIG. 1, and FIG. 3 is a cross-sectional view of FIG. 2, taken along the line III-III. The display device according to the first exemplary embodiment is an organic light emitting diode (OLED) display.

Referring to FIG. 1, an OLED display 100 includes a transparent area TA and a plurality of pixel areas PA that are separated from each other along a first direction and a second direction with the transparent area TA interposed between the pixel areas PA. The second direction is perpendicular to the first direction. The first direction is, for example, the horizontal direction (x-axis direction of FIG. 1) of the screen realized by the OLED display 100, and the second direction is, for example, the vertical direction (y-axis direction of FIG. 1) of the screen realized by the OLED display 100.

One pixel area PA refers to an area where one pixel formed of one sub-pixel or a plurality of sub-pixels is formed. A pixel is a minimum unit for displaying an image, and the OLED display 100 displays an image using a plurality of pixels. Hereinafter, a case in which one sub-pixel is provided in each pixel area PA will be exemplarily described. However, the present invention is not limited to the following example.

Referring to FIG. 2 and FIG. 3, the OLED display 100 includes a switching thin film transistor 20, a driving thin film transistor 30, a capacitor 40, and an organic light emitting element 50 that are formed at each pixel area PA. In addition, the OLED display 100 further includes gate lines 11 extending along one direction, and data lines 12 and common power lines 13 that are insulated from and cross the gate lines 11 on the pixel area PA and the transparent area TA.

The gate lines 11 may extend in parallel with the horizontal direction (x-axis direction) throughout the plurality of pixel areas PA, and the data lines 12 and the common power lines 13 may extend in parallel with the vertical direction (y-axis direction) throughout the plurality of pixel areas PA. Therefore, a minimum number of gate lines 11, data lines 12, and common power lines 13 are formed on the transparent area TA.

The organic light emitting element 50 includes a pixel electrode 51, an organic emission layer 52 formed on the pixel electrode 51, and a common electrode 53 formed on the organic emission layer 52. The pixel electrode 51 may be a hole injection electrode, and the common electrode 53 may be an electron injection electrode. However, the present invention is not limited thereto, and the pixel electrode 51 may be the electron injection electrode, and the common electrode 53 may be the hole injection electrode according to a driving method of one embodiment.

Holes and electrons from the pixel electrode 51 and the common electrode 53 are injected into the organic emission layer 52. Light is emitted from the organic emission layer 52 when excitons being combinations of the injected holes and electrons drop from an excited state to a ground state. The organic emission layer 52 is formed of one of a red organic emission layer, a green organic emission layer, and a blue organic emission layer.

The pixel electrode 51 and the organic emission layer 52 formed thereon are provided throughout the plurality of pixel areas PA. That is, an area where the pixel electrode 51 and the organic emission layer 52 are formed is substantially equal to the pixel area PA, and the shape of the pixel electrode 51 and the organic emission layer 52 is substantially the shape of the pixel area PA. The pixel electrode 51 and the organic emission layer 52 cover the switching thin film transistor 20, the driving thin film transistor 30, the capacitor 40, the gate line 11, the data line 12, and the common power line 13 formed in the pixel area PA.

The common electrode 53 may be formed throughout the transparent area TA and the plurality of pixel areas PA. The common electrode 53 is formed of a transparent conducting material or a transflective conducting material such that it is transparent. The pixel electrode 51 is formed of a reflective conducting material. Therefore, the OLED display 100, according to one exemplary embodiment, is a front emission type that displays an image by emitting light toward the common electrode 53 from the organic emission layer 52.

Indium tin oxide (ITO), indium zinc oxide (IZO), zinc oxide (ZnO), or indium oxide ($In_2O_3$) may be used as the transparent conducting material for the common electrode 53, and at least one of magnesium (Mg), silver (Ag), calcium (Ca), lithium (Li), and aluminum (Al) may be used as the transflective conducting material.

Lithium (Li), calcium (Ca), lithium fluoride/calcium (LiF/Ca), lithium fluoride/aluminum (LiF/Al), aluminum (Al), silver (Ag), magnesium (Mg), or gold (Au) may be used as a reflective conducting material for forming the pixel electrode 51. In addition, the pixel electrode 51 may be formed with a multi-layered structure including a transparent conductive layer and a reflective layer, for example, a multi-layered structure of ITO/silver (ITO/AG).

The switching thin film transistor 20 includes a switching semiconductor layer 21, a switching gate electrode 22, a switching source electrode 23, and a switching drain electrode 24. The driving thin film transistor 30 includes a driving semiconductor layer 31, a driving gate electrode 32, a driving source electrode 33, and a driving drain electrode 34. The capacitor 40 includes a first sustain electrode and a second sustain electrode 42 with an interlayer insulating layer 14 interposed therebetween.

The switching thin film transistor 20 is used as a switch for selecting a sub-pixel for light emission. The switching gate electrode 22 is connected to the gate line 11, and the switching source electrode 23 is connected to the data line 12. The switching drain electrode 24 is spaced from the switching source electrode 23, and is connected to the first sustain electrode 41.

The driving thin film transistor 30 applies a driving voltage to the pixel electrode 51 to emit light from the organic emission layer 25 of the organic light emitting element 50 in the selected sub-pixel. The driving gate electrode 32 is connected with the first sustain electrode 41, and the driving source electrode 33 and the second sustain electrode 42 are connected with the common power line 13. The driving drain electrode 34 is connected with the pixel electrode 51 of the organic light emitting element 50 through a contact hole.

The switching thin film transistor 20 is driven by a voltage applied to the gate line 11 to transmit a data voltage applied to the data line 12 to the driving thin film transistor 30. A voltage is stored in the capacitor 40 and corresponds to a voltage difference between a voltage (e.g., a common voltage) applied to the driving thin film transistor 30 from the power source line 13 and the data voltage transmitted from the switching thin film transistor 20, and a current corresponding to the voltage stored in the capacitor 40 flows to the organic light emitting element 50 through the driving thin film transistor 30 such that the organic emission layer 52 emits light.

Referring to FIG. 3, the above-described constituent elements are located on the substrate member 10, and the OLED display 100 may further include an encapsulation substrate 19 for covering the substrate member 10. A buffer layer 15, a gate insulating layer 16, an interlayer insulating layer 14, a planarization layer 17, and a pixel defining layer 18 are further formed on the substrate member 10.

The buffer layer 15 contacts the substrate member 10 from above the substrate member 10. The gate insulating layer 16 is interposed between the driving semiconductor layer 31 and the driving gate electrode 32 as an insulator. An interlayer insulating layer 14 covers the driving gate electrode 32 to insulate the driving source electrode 33 and the driving drain electrode 34 from the driving gate electrode 32. A planarization layer 17 is below the pixel electrode 51 while covering the driving source electrode 33 and the driving drain electrode 34.

Although it is not shown in FIG. 3, locations of the gate insulating layer 16, the interlayer insulating layer 14, and the planarization layer 17 of the switching thin film transistor 20 may be the same as in the driving thin film transistor 30.

The pixel defining layer 18 is formed on the planarization layer 17 and forms an opening corresponding to the pixel area PA to expose the pixel electrode 51. The organic emission layer 52 is formed on the pixel electrode 51 exposed by the opening of the pixel defining layer 18. The common electrode 53 is formed on the organic emission layer 52 and the pixel defining layer 18.

The buffer layer 15, the gate insulating layer 16, the interlayer insulating layer 14, the planarization layer 17, and the pixel defining layer 18 are made of insulating materials that are transparent or have high transmittance.

The buffer layer 15 may include one of silicon nitride ($SiN_x$), silicon oxide ($SiO_2$), and silicon oxynitride ($SiO_xN_y$). The gate insulating layer 16 and the interlayer insulating layer 14 may include silicon nitride ($SiN_x$) or silicon oxide ($SiO_2$). The planarization layer 17 may include at least one of an acrylic resin, an epoxy resin, a phenolic resin, a polyamide resin, and a polyimide resin. The pixel defining layer 18 may include a polyacrylate resin, a polyimide resin, or a silica-based inorganic material.

Referring to FIG. 2 and FIG. 3, the switching thin film transistor 20 and the driving thin film transistor 30 may be formed of a transparent or highly transmissive conducting material. In further detail, the switching gate electrode 22, the switching source electrode 23, the switching drain electrode 24, the driving gate electrode 32, the driving source electrode 33, and the driving drain electrode 34 may include a transparent or highly transmissive conducting material, for example, indium tin oxide (ITO), indium zinc oxide (IZO), zinc oxide (ZnO), or indium oxide ($In_2O_3$).

As described above, the overall transparency of the OLED display 100 when the pixel areas PA are in the turn-off state can be increased by forming the constituent elements, excluding the pixel electrode 51 and the organic emission layer 52, with transparent or highly transmissive materials.

Figure 4:
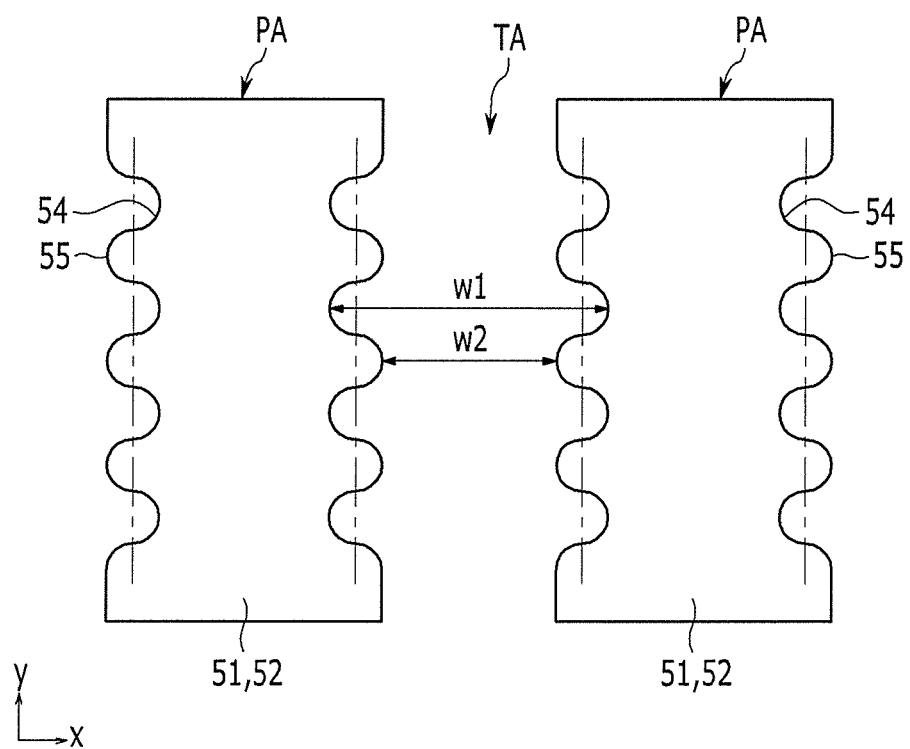
FIG. 4 is an enlarged plan view of a portion of the display device of FIG. 1.

FIG. 4 shows a portion of the display device of FIG. 1, illustrating two enlarged adjacent pixel areas PA. In the pixel areas PA in FIG. 4, the pixel electrode 51 and the organic emission layer 52 have substantially the same shape.

Referring to FIG. 4, the width of a transparent area TA measured along the horizontal direction (x-axis direction) between two adjacent pixel areas PA in the horizontal direction (x-axis direction) varies along the vertical direction. That is, the transparent area TA has a varying width along the vertical direction of the screen realized by the OLED display 100.

In FIG. 4, the transparent area TA has a maximum width w1 and a minimum width w2, and the width of the transparent area TA varies between the maximum width w1 and the minimum width w2 along the vertical direction. The shape of the pixel electrode 51 and the organic emission layer 52 may be arbitrary to vary the width of the transparent area TA.

The pixel electrode 51 and the organic emission layer 52 include a pair of long sides that are parallel with the vertical direction, and the pair of long sides are shaped with a recess portion 54 and a convex portion 55 alternately arranged along the vertical direction. The recess portion 54 has a semi-circle shape, and the convex portion 55 may have a semi-circle shape according to one embodiment of the present invention.

Each of the recess portions 54 has the same shape and size, and each of the convex portions 55 may have the same shape and size. A curvature radius of the recess portion 54 and a curvature radius of the convex portion 55 may be located in the same line along the vertical direction. The pixel electrode 51 and the organic emission layer 52 are left-to-right symmetrical with each other with respect to an imaginary vertical line that cuts across the center line thereof along the vertical direction.

As described above, the pixel electrode 51 and the organic emission layer 52 have a pair of long sides with wavy line rather than a straight line, and the horizontal width of the pixel electrode 51 and the organic emission layer 52 varies along the vertical direction. Accordingly, the transparent area TA also has a varying width rather than forming a strip pattern with a constant width, and the maximum width w1 and the minimum width w2 of the transparent area TA are alternately repeated along the vertical direction.

Thus, since the width of the transparent area TA in the OLED display 100 of the present exemplary embodiment does not have significant periodicity due to the wavy shapes of the pixel area 51 and the organic emission layer 52, diffraction interference of light passing through the OLED display 100 when the pixel areas PA are in the switch-off state can be suppressed or reduced. That is, when the pixel areas PA are in the switch-off state, the diffraction interference is suppressed or reduced when light of an object at the opposite side of the OLED display 100 passes through the transparent area TA so that the image of the object may be prevented from being distorted into multiple images.

Accordingly, the OLED display 100 of the exemplary embodiment shown in FIG. 4 does not experience image distortion due to multiple images when the pixel areas PA are in the switch-off state, and quality of the screen realized by the OLED display 100 can be improved when the pixel areas PA are in the switch-on state.

Although it is described in the first exemplary embodiment (FIG. 4) that the long side of the organic emission layer 52 is shaped by iteratively arranging the recess portions 54 and the convex portions 55, the long side of the organic emission layer 52 may be shaped by separately arranging the convex portions without the recess portions 54 or separately arranging the recess portions 54 without the convex portions 55.

In addition, the pixel electrode 51 of the OLED display 100 according to the first exemplary embodiment is formed with a shape that is the same as the organic emission layer 52, but the pixel electrode 51 may have a rectangular shape and the organic emission layer 52 may have the shape illustrated in FIG. 4. In this case, a mask pattern may not need to be changed during a conducting material deposition process for forming the pixel electrode 51, and accordingly a manufacturing process of the OLED display 100 can be simplified.

In addition, the OLED display 100 according to the first exemplary embodiment is an active matrix type OLED display provided with the switching thin film transistor 20 and the driving thin film transistor 30, but it may be a passive matrix OLED display not provided with the switching thin film transistor 20 and the driving thin film transistor 30.

That is, a plurality of hole injection electrodes are formed along the horizontal direction of the substrate member 10, a plurality of electron injection electrodes are formed along a direction crossing the direction of the hole injection electrodes, and the organic emission layer 52 is arranged between the hole injection electrodes and the electron injection electrodes such that a passive matrix type OLED display can be manufactured. In this case, the organic emission layer 52 has the shape illustrated in FIG. 4.

In addition, the OLED display 100 of the first exemplary embodiment is provided with two thin film transistors 20 and 30 and one capacitor 40, but the present invention is not limited thereto. The OLED display 100 may have three or more thin film transistors and two or more capacitors at each pixel area PA, and various other structures with separate wires.

Figure 5:
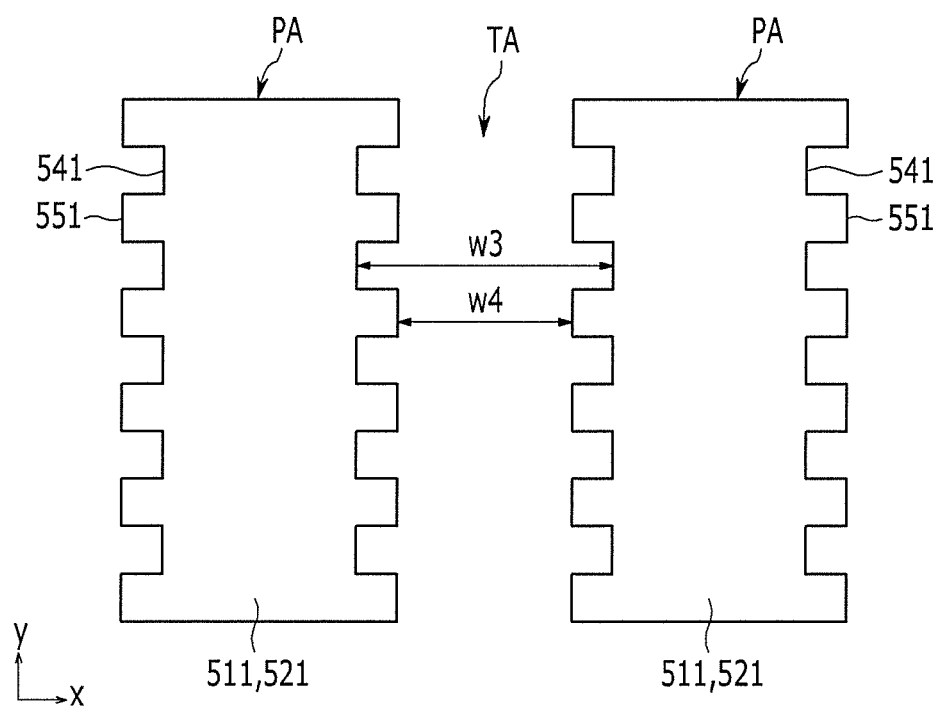
FIG. 5 is a plan view of a layout of a display device according to a second exemplary embodiment.

FIG. 5 is a plan view of a layout of a display device according to a second exemplary embodiment, and constituent elements of the display device of the second exemplary embodiment are the same as those of the first exemplary embodiment, excluding the shape of the pixel area PA. Hereinafter, parts that are different from the first exemplary embodiment will be described in further detail.

Referring to FIG. 5, each pixel area PA of the display device of the second exemplary embodiment is shaped with a rectangular recess portion 541 and a rectangular convex portion 551 that are alternately arranged along the vertical direction (y-axis) of the screen. The recess portions 541 have the same shape and size, and the convex portions 551 also have the same shape and size. Here, each of the pixel areas PA is right-to-left symmetrical. The pixel area PA shown in FIG. 5 has the same shape as the organic emission layer 521, and it may have the same shape as a pixel electrode 511.

A transparent area TA has two widths, that is, a maximum width w3 and a minimum width w4 between two adjacent pixel areas PA in the horizontal direction (x-axis direction), and the maximum width w3 and the minimum width w4 alternate iteratively along the vertical direction of the screen. As described above, periodicity of the width of the transparent area TA is weakened or reduced by varying the width of the transparent area TA to thereby suppress or reduce diffraction interference of light transmitted through the display device.

The shapes of the recess and convex portions are not limited to the semi-circle or rectangular shape, and a long side of the organic emission layer may be formed with other suitable shapes (e.g., a sine waveform).

Figure 6:
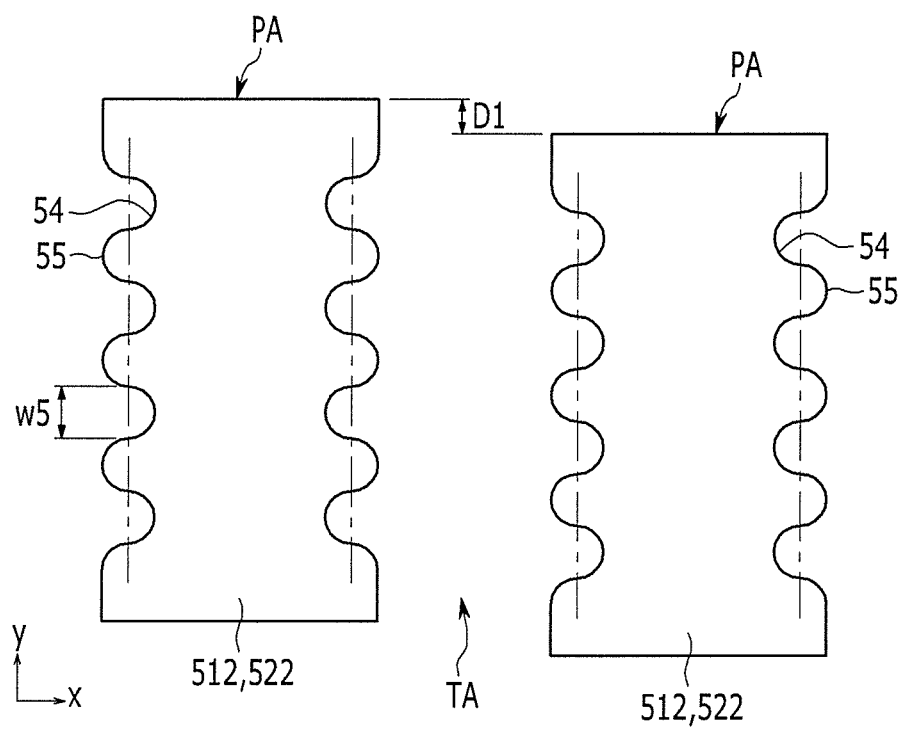
FIG. 6 is a plan view of a layout of a display device according to a third exemplary embodiment.

FIG. 6 is a plan view of a layout of a display device according to a third exemplary embodiment. Constituent elements of the display device of the third exemplary embodiment are the same as those of the first exemplary embodiment, excluding the shape of a pixel area. Hereafter, parts different from the first exemplary embodiment will be described in further detail.

Referring to FIG. 6, a pixel area PA in the display device of the third exemplary embodiment is the same as the pixel area PA of the first exemplary embodiment, except that two adjacent pixel areas PA in the horizontal direction (x-axis direction) of the screen have a height difference D1 (e.g., a predetermined height difference) along the vertical direction (y-axis direction) of the screen.

That is, one of the two pixel areas PA is moved along the vertical direction of the screen such that the two pixel areas PA are offset by a height difference D1 with respect to the each other. The pixel area PA in FIG. 6 has the same shape as an organic emission layer 522, and may have the same shape as a pixel electrode 512.

As described above, since a wavy pattern at one side of a transparent area TA and a wavy pattern at the other side of the transparent area TA do not align with each other as the pixel areas PA are offset along the vertical direction, periodicity of the width of the transparent area TA can be further weakened compared to the first exemplary embodiment. Therefore, diffraction interference of light passing through the display device can be effectively suppressed or reduced.

In this case, the height difference D1 between the pixel areas PA is set to be different from a maximum width w5 of the recess portion 54 or the convex portion 55. If the height difference D1 between the pixel areas PA is the same as the maximum width w5 of the recess portion 54 or the convex portion 55, the transparent area TA has a constant width along the vertical direction of the screen such that the periodicity is strengthened or increased. FIG. 6 illustrates that the recess portion 54 and the convex portion 55 have a semi-circle shape, but they may have a rectangular shape.

Figure 7:
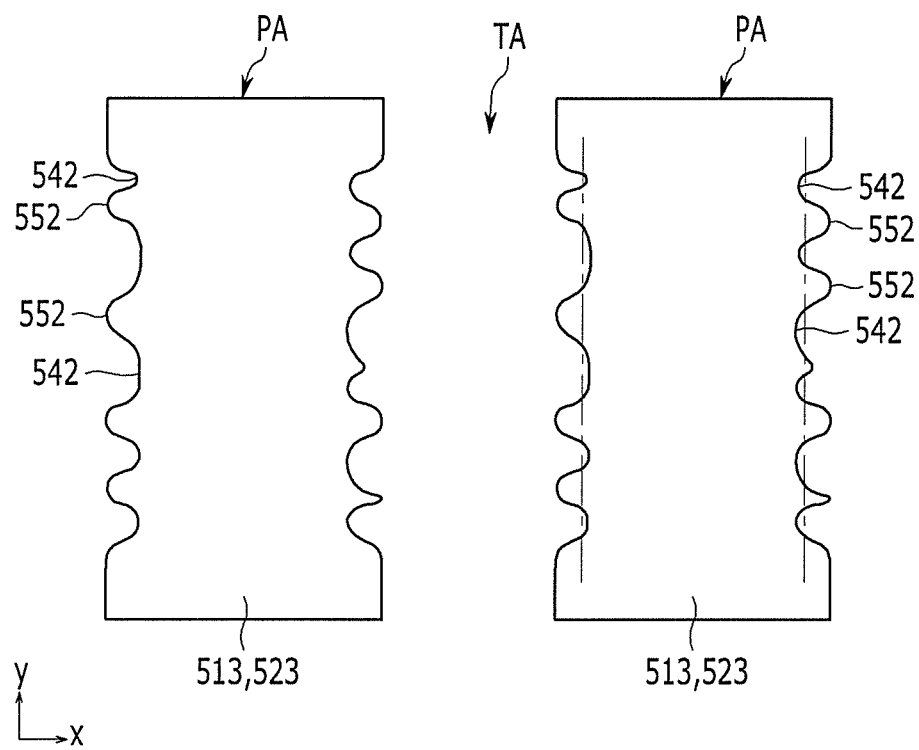
FIG. 7 is a plan view of a layout of a display device according to a fourth exemplary embodiment.

FIG. 7 is a plan view of a layout of a display device according to a fourth exemplary embodiment. Constituent elements of the display device of the third exemplary embodiment are the same as those of the first exemplary embodiment, excluding the shape of a pixel area. Hereafter, parts different from the first exemplary embodiment will be described in further detail.

Referring to FIG. 7, a pixel area PA in the display device of the fourth exemplary embodiment includes at least two recess portions 542 that are different in shape and size, and at least two convex portions 552 that are different in shape and size. That is, the recess portions 542 and the convex portions 552 forming a long side of the pixel area PA have inconsistent or irregular shapes and sizes. The pixel area PA in FIG. 7 has the same shape as an organic emission layer 523, and it may have the same shape as a pixel electrode 513.

Therefore, one long side and the other long side of a transparent area TA have different shapes between the two pixel areas PA, and periodicity of the width of the transparent area TA is completely or substantially eliminated. Accordingly, diffraction interference of light passing through the display device of the fourth exemplary embodiment can be substantially eliminated.

In the above description, the display device is the OLED display, but the display device may be realized as a field emission display. If the display device is realized as a field emission display, the pixel area has the same shape as the phosphor layer.

Figure 8:
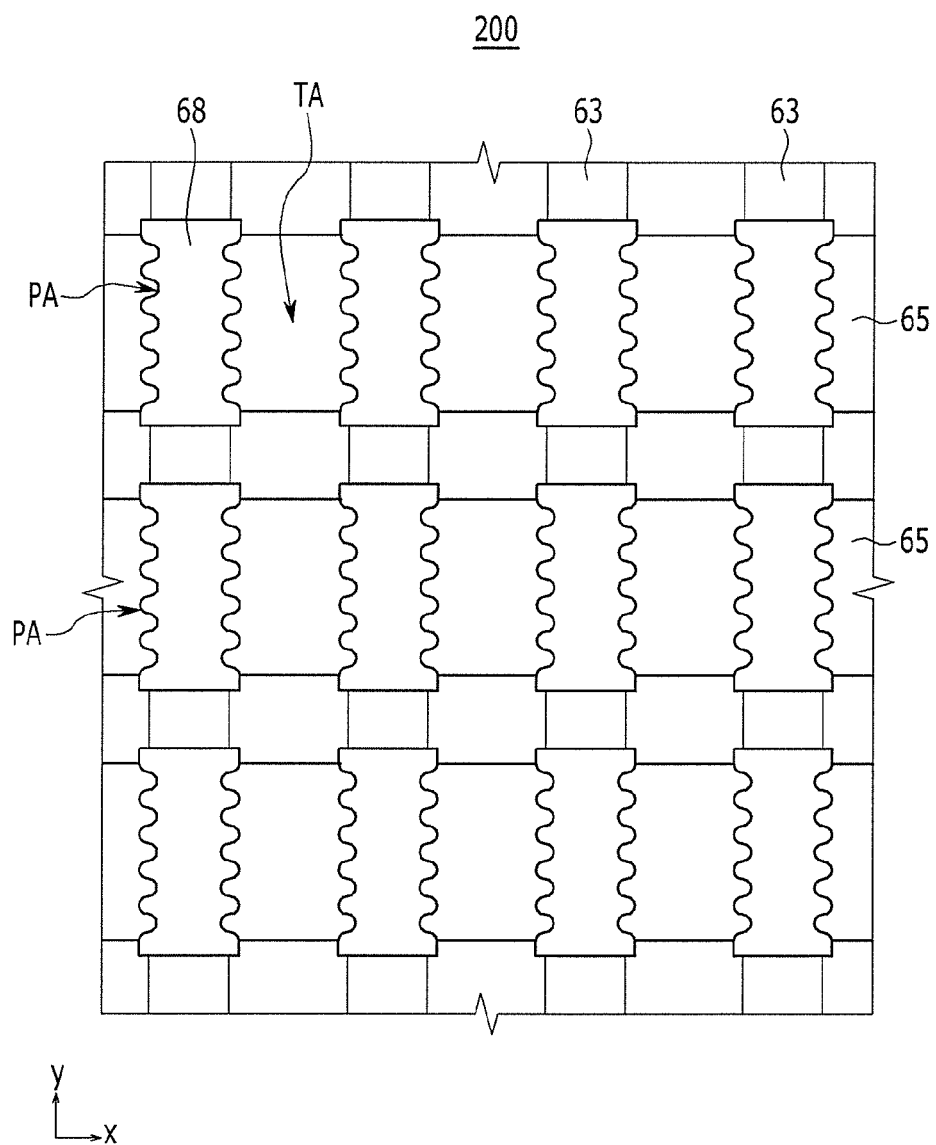
FIG. 8 is a plan view of a layout of a display device according to a fifth exemplary embodiment.
Figure 9:
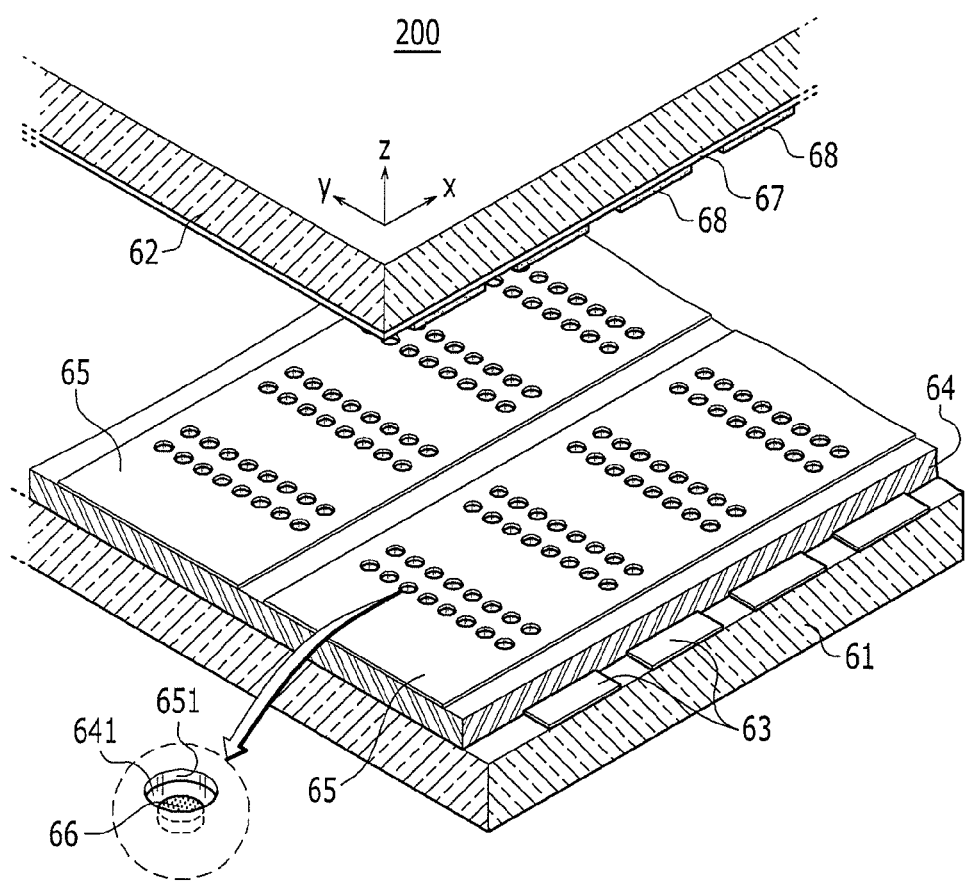
FIG. 9 is an exploded perspective view of a portion of the display device according to the fifth exemplary embodiment.

FIG. 8 is a plan view of a layout of a display device according to a fifth exemplary embodiment, and FIG. 9 is an exploded perspective view of a portion of the display device according to the fifth exemplary embodiment.

Referring to FIG. 8 and FIG. 9, a field emission display 200 includes a first substrate 61 and a second substrate 62 arranged in parallel with each other as substrate members with a vacuum area formed therebetween. A structure for electron emission is located on one side of the first substrate 61, facing the second substrate 62, and a structure, which emits visible light when it is excited by electrons, is located on one side of the second substrate 62, facing the first substrate 61.

In further detail, a cathode 63, an insulation layer 64, a gate electrode 65, and an electron emission region 66 are formed on the first substrate 61. The cathode 63 may extend in parallel with the vertical direction (y-axis direction) of the screen, and the gate electrode 65 may extend in parallel with the horizontal direction (x-axis direction) of the screen. The insulation layer 64 is located between the cathode 63 and the gate electrode 65 as an insulator. Openings 651 and 641 are formed in the gate electrode 65 and the insulation layer 64, respectively, and the electron emission region 66 is formed on the cathode 63 inside the openings 651 and 641.

Crossing areas between the cathode 63 and the gate electrode 65 correspond to pixel areas PA, and an area between the pixel areas PA is a transparent area TA. Here, the cathode 63 and the gate electrode 65 are formed of a transparent or highly transmissive conducting material, and the insulation layer 64 is formed of a transparent or highly transmissive insulating material. For example, the cathode 63 and the gate electrode 65 may include indium tin oxide (ITO), indium zinc oxide (IZO), zinc oxide (ZnO), or indium oxide ($In_2O_3$), and the insulation layer 64 may include silicon nitride ($SiN_x$) or silicon oxide ($SiO_2$).

The electron emission region 66 includes a material, for example, carbon nanotubes, that emits electrons when an electric field is applied thereto in a vacuum state. In addition to the carbon nanotubes, the electron emission region 66 may include a carbon-based material such as graphite or a nanometer-sized material such as nanowires. A plurality of electron emission regions 66 are provided in each pixel area PA.

An anode 67 and phosphor layers 68 are formed on the second substrate 62. The anode 67 is on both of the pixel area PA and the transparent area TA, and may be made of indium tin oxide (ITO). The phosphor layers 68 are spaced apart from each other along the horizontal and vertical directions of the screen. Each of the phosphor layers 68 is formed of one of a red phosphor layer, a green phosphor layer, and a blue phosphor layer.

An electric field is formed at the periphery of the electron emission region 66 of the pixel area PA where a voltage difference across the cathode 63 and the gate electrode 65 is greater than a threshold value when a scan voltage is applied to one of the cathode 63 and the gate electrode 65 and a data voltage is applied to the other. Then, electrons are emitted from the electron emission region 66 by the electric field, and the electrons collide with the phosphor layers 68 when the electrons are attracted by a high voltage applied to the anode 67 such that the phosphor layers 68 emit light.

The phosphor layer 68 is located in a crossing area of the cathode 63 and the gate electrode 65, which is in the pixel area PA, and the shape of the phosphor layer 68 determines the shape of the pixel area PA. The shape of the phosphor layer 68 may be the same as that of the organic emission layer of any of the first to fourth exemplary embodiments, to thereby weaken periodicity of the width of the transparent area TA. FIG. 8 exemplarily illustrates that the shape of the phosphor layer 68 is the same as that of the organic emission layer of the first exemplary embodiment.

Therefore, diffraction interference of light transmitted through the field emission display 200 is suppressed to prevent or reduce image distortion due to multiple images when the pixel areas PA are in the switch-off state and increase quality of the screen realized by the field emission display 200 when the pixel areas PA are in the switch-on state.

Hereinafter, simulation results of a diffracted image measured by several display devices will be described. Here, the diffracted image refers to an image that is distorted by diffraction when an image of an object located at the opposite side of a display device passes through the display device.

Experimental Example 1

Comparative Example

In a display device of Experimental Example 1, a transparent area has a single horizontal width, and the horizontal width of a pixel area in this experiment is 102 μm and the horizontal width of the transparent area is 50 μm.

Figure 10:
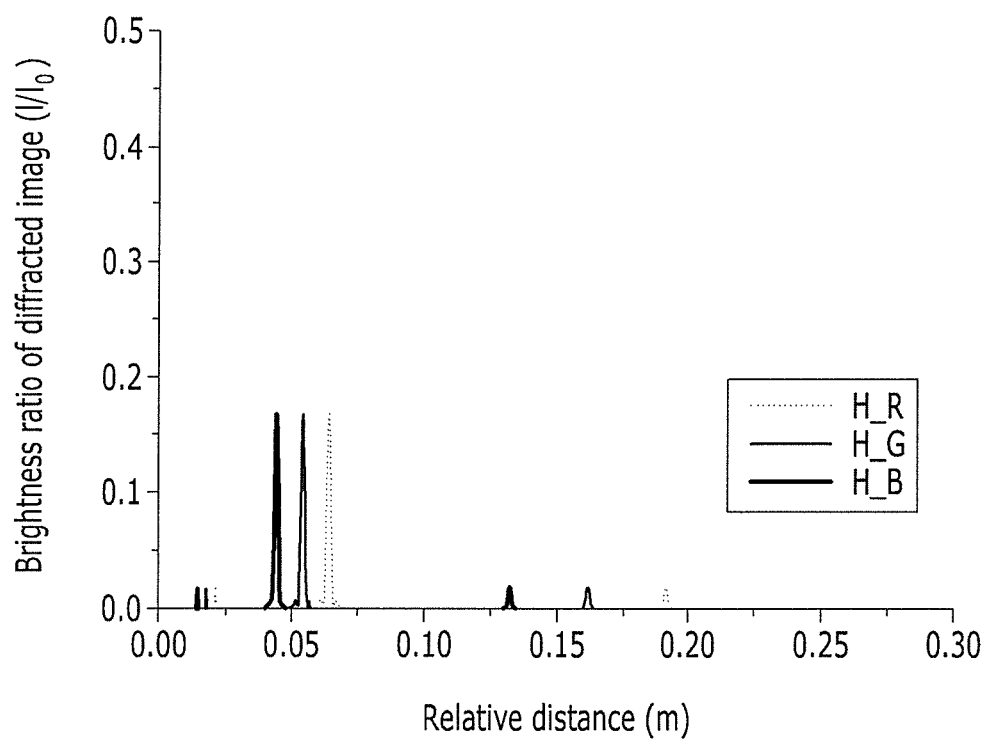
FIG. 10 is a graph showing a simulation result of a diffracted image measured from a display device of Experimental Example 1.

FIG. 10 is a graph showing a simulation result of a diffracted image measured with the display device of Experimental Example 1.

In the graph of FIG. 10, the vertical axis denotes a brightness ratio of the diffracted image, which is a ratio of brightness I of a diffracted image with respect to brightness $I_O$ of an image (for convenience, referred to as "one-transmission image") that is transmitted without being diffracted. The horizontal axis in the graph denotes a relative distance of the diffracted image, which is a distance of the diffracted image with respect to the one-transmission image. Here, the zero point in the graph indicates a location of the one-transmission image. In the graph, H_R, H_G, and H_B respectively represent a diffracted image of red light, a diffracted image of green light, and a diffracted image of blue light with respect to the horizontal direction.

Referring to FIG. 10, it is observed that a diffracted image having brightness of 18% with respect to the brightness of the one-transmission image appears at a location about 5 cm from the zero point on the horizontal axis when an observer is located 1 m in front of the display device of Experimental Example 1 (comparative example). The diffracted image can be easily observed with the naked eye, and multiple images due to diffraction interference cause image distortion.

Experimental Example 2

Exemplary Embodiment 1

Figure 11:
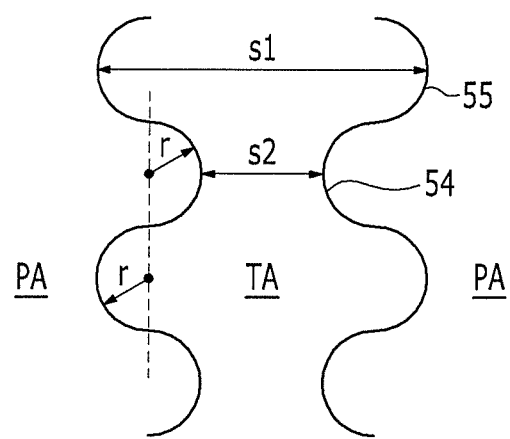
FIG. 11 is an enlarged plan view of a portion of a pixel area in a display device of Experimental Example 2.

FIG. 11 is an enlarged view of portions of a pixel area and a transparent area of a display device of Experimental Example 2.

In the display device of Experimental Example 2, a long side of the pixel area PA is shaped with alternately arranged semi-circular recess portions 54 and semi-circular convex portions 55. The radius r of the semi-circle applied in the experiment is 10 μm, and the maximum horizontal width s1 and the minimum horizontal width s2 of a transparent area TA are 70 μm and 30 μm, respectively.

Figure 12:
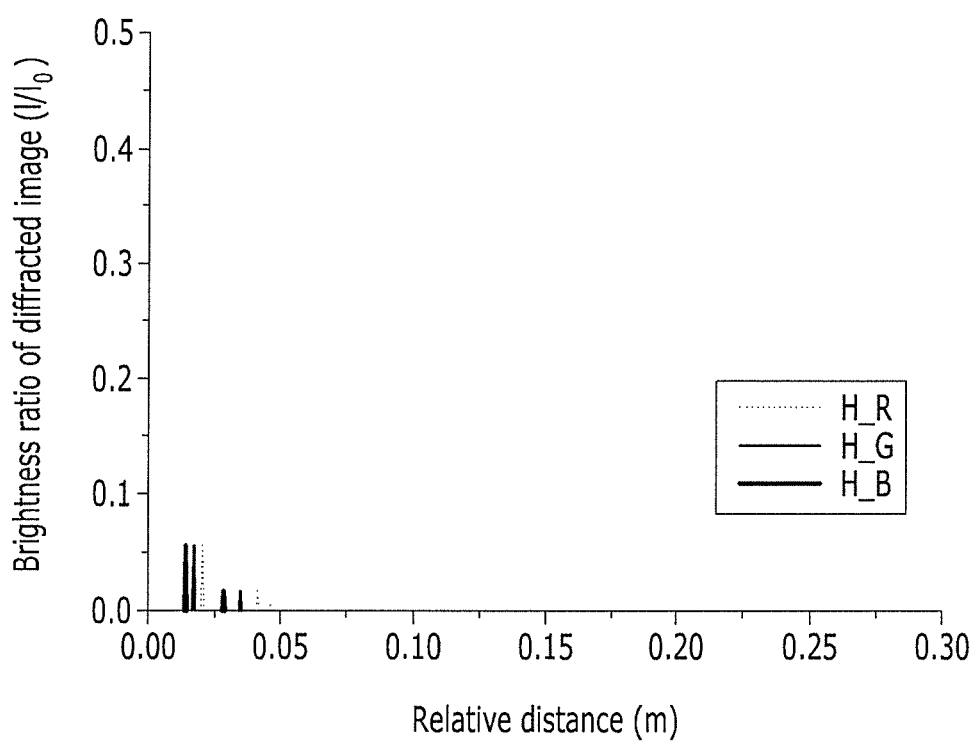
FIG. 12 is a graph showing a simulation result of a diffracted image measured from the display device of Experimental Example 2.

FIG. 12 is a graph showing a simulation result of a diffracted image measured with the display device of Experimental Example 2.

Referring to FIG. 12, it is observed that a diffracted image having a brightness of less than 6% with respect to the brightness of the one-transmission image appears at a location within 2.5 cm from the zero point on the horizontal axis when an observer is located 1 m in front of the display device of Experimental Example 2 (Exemplary Embodiment 1). The diffracted image cannot be easily observed with the naked eye, and the observer hardly recognizes image distortion caused by diffraction interference due to multiple images.

Experimental Example 3

Exemplary Embodiment 2

Figure 13:
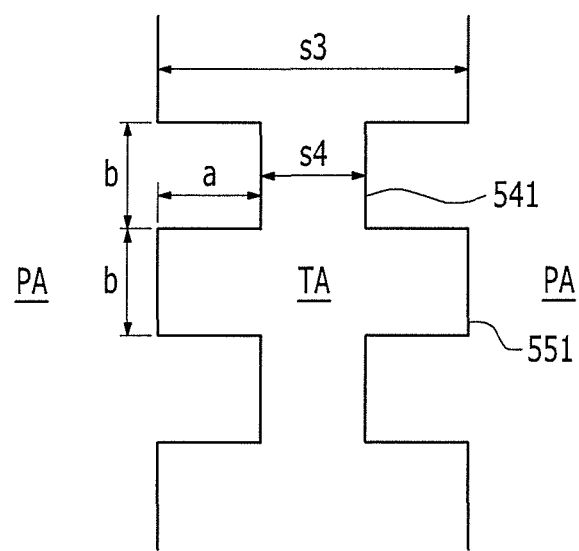
FIG. 13 is an enlarged plan view of a portion of a pixel area of a display device of Experimental Example 3.

FIG. 13 is an enlarged view of a portion of a pixel area in a display device of Experimental Example 3.

In the display device of Experimental Example 3, a long side of a pixel area PA is shaped with alternately arranged rectangular recess portion 541 and rectangular convex portion 551. A horizontal width a and a vertical width b of the recess portion 541 and the convex portion 551 applied in the experiment are respectively 20 μm, and the maximum horizontal width s3 and the minimum horizontal width s4 of a transparent area TA are 70 μm and 30 μm, respectively.

Figure 14:
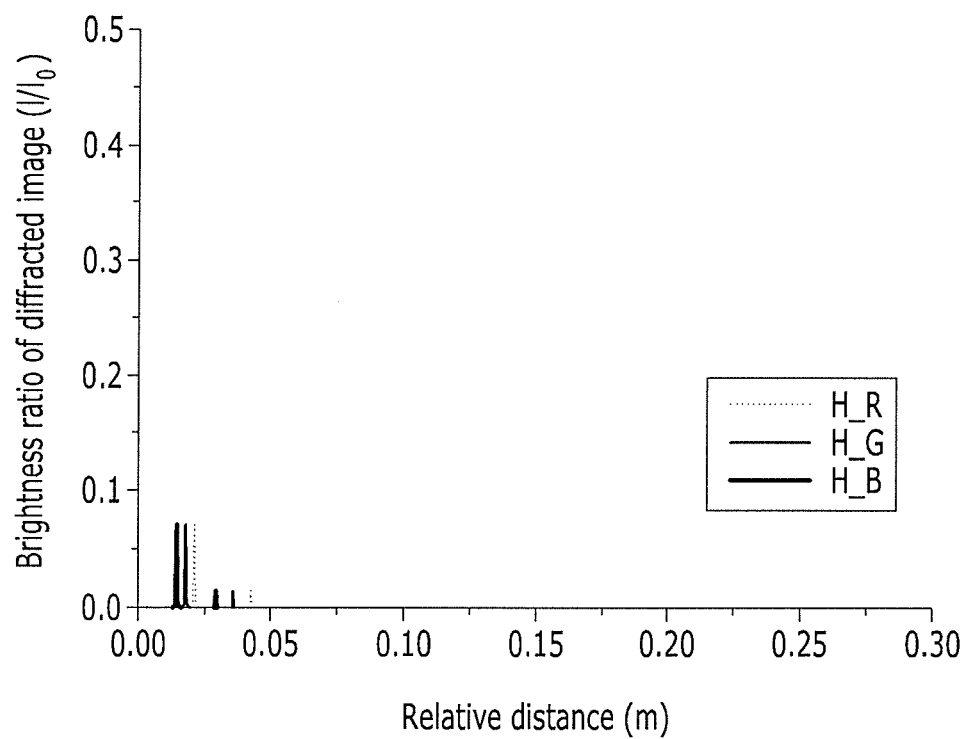
FIG. 14 is a graph showing a simulation result of a diffracted image measured from the display device of Experimental Example 3.

FIG. 14 is a graph showing a simulation result of a diffracted image measured with a display device of Experimental Example 3.

Referring to FIG. 14, it is observed that a diffracted image having a brightness of less than 8% with respect to the brightness of the one-transmission image appears at a location within 2.5 cm from the zero point on the horizontal axis when an observer is located 1 m in front of the display device of Experimental Example 3 (Exemplary Embodiment 2). Since the location of the diffracted image is close to the location of the one-transmission image and the brightness ratio of the diffracted image is less than 10%, the diffracted image cannot be easily recognized with the naked eye.

Experimental Example 4

Exemplary Embodiment 3

In a display device of Experimental Example 4, the shape of a pixel area PA is the same as that of Experimental Example 2. However, one of two adjacent pixel areas PA in the horizontal direction is moved down about 10 μm in the vertical direction.

Figure 15:
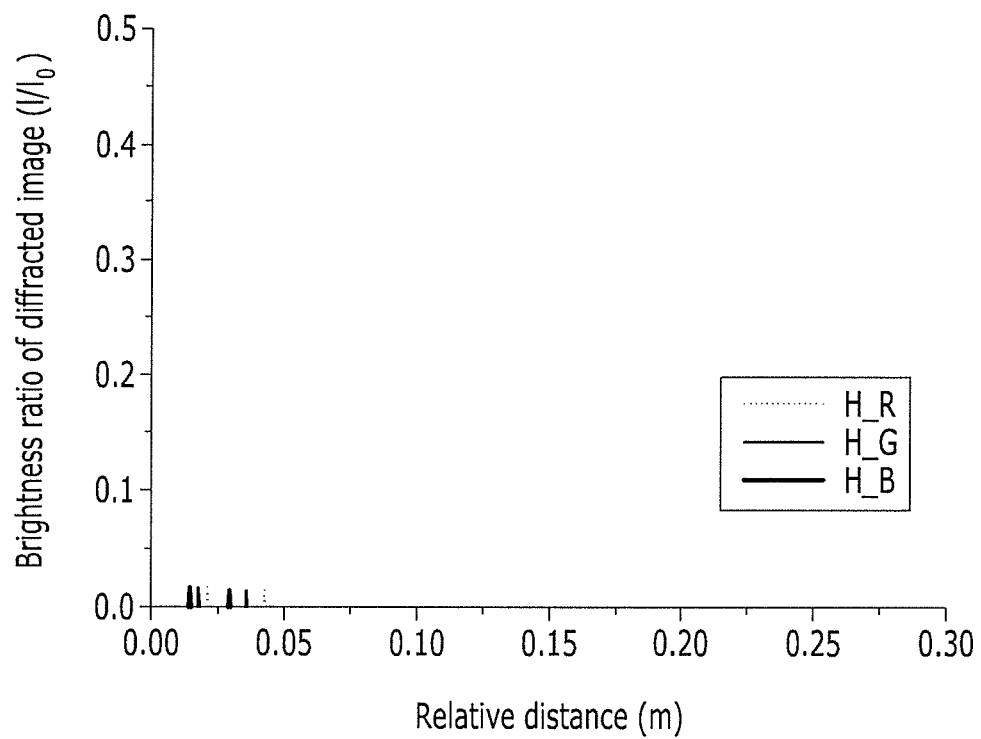
FIG. 15 is a graph showing a simulation result of a diffracted image measured from a display device of Experimental Example 4.

FIG. 15 is a graph showing a simulation result of a diffracted image measured with the display device of Experimental Example 4.

Referring to FIG. 15, it is observed that a diffracted image having a brightness of about 2% with respect to the brightness of the one-transmission image appears at a location within 5 cm from the zero point on the horizontal axis when an observer is located 1 m in front of the display device of Experimental Example 4 (Exemplary Embodiment 3). The diffracted image can hardly be observed with the naked eye, and image distortion caused by diffraction interference due to multiple images does not substantially occur.

While this disclosure has been described in connection with what is presently considered to be practical exemplary embodiments, it is to be understood that the invention is not limited to the disclosed embodiments, but, on the contrary, it is intended to cover various modifications and equivalent arrangements included within the spirit and scope of the appended claims and their equivalents.

DESCRIPTION OF REFERENCE CHARACTERS

100: OLED display
TA: transparent region
PA: pixel area
11: gate line
12: data line
13: common power line
20: switching thin film transistor
30: driving thin film transistor
40: capacitor
50: organic light emitting element
51: pixel electrode
52: organic emission layer
54: recess portion
55: convex portion
200: field emission display
63: cathode
64: insulation layer
65: gate electrode
66: electron emission region
67: anode
68: phosphor layer

What is claimed is:
1. A display device comprising:
a substrate member comprising a transparent area and pixel areas, the pixel areas being spaced apart from each other along a first direction and a second direction, the transparent area being located between the pixel areas, the second direction being perpendicular to the first direction; and an emission layer located at each of the pixel areas,
wherein a width of the transparent area along the first direction between two pixel areas among the pixel areas varies along the second direction.

2. The display device of claim 1, wherein the first direction is a horizontal direction of a screen realized by the substrate member, and the second direction is a vertical direction of the screen.

3. The display device of claim 2, wherein a width of the emission layer along the horizontal direction varies along the vertical direction.

4. The display device of claim 3, wherein the emission layer comprises a pair of long sides in parallel with the vertical direction, and the pair of long sides comprise recess portions that are spaced apart from each other and convex portions between the recess portions.

5. The display device of claim 4, wherein the recess portions and the convex portions have a semi-circle shape or a rectangular shape.

6. The display device of claim 4, wherein the recess portions have a same shape and size, the convex portions have a same shape and size, and the pair of long sides are symmetrical with respect to an axis extending in the second direction.

7. The display device of claim 6, wherein two adjacent emission layers in the horizontal direction are offset from each other by an offset distance in the vertical direction.

8. The display device of claim 7, wherein the offset distance between the two adjacent emission layers is different from a maximum width of the recess portions or the convex portions.

9. The display device of claim 4, wherein at least two of the recess portions are different from the other recess portions in shape and size, and at least two of the convex portions are different from the other convex portions in shape and size.

10. The display device of claim 3, wherein the emission layer comprises an organic emission layer, and
the display device further comprises a hole injection electrode at one side of the organic emission layer and an electron injection electrode at the other side of the organic emission layer.

11. The display device of claim 10, wherein the hole injection electrode is a pixel electrode comprising a reflective conducting material, and the electron injection electrode is a common electrode comprising a semi-transparent conducting material.

12. The display device of claim 11, wherein the pixel electrode and the organic emission layer have a same shape.

13. The display device of claim 10, further comprising a thin film transistor and a capacitor at the pixel area, the thin film transistor being electrically connected with one of the hole injection electrode or the electrode injection electrode.

14. The display device of claim 13, further comprising a buffer layer, an insulation layer, a planarization layer, and a pixel defining layer each comprising a transparent or semi-transparent insulating material and being formed on the substrate member.

15. The display device of claim 13, wherein the thin film transistor comprises a gate electrode, a source electrode, and a drain electrode, each of said electrodes comprising a transparent or semi-transparent conducting material.

16. The display device of claim 3, wherein the substrate member comprises a first substrate and a second substrate with a vacuum area therebetween, and the emission layer comprises a phosphor layer on the second substrate.

17. The display device of claim 16, further comprising a cathode and a gate electrode crossing each other on the first substrate, an insulation layer between the cathode and the gate electrode, an electron emission region electrically coupled to the cathode, and an anode on the second substrate.

18. The display device of claim 17, wherein the cathode and the gate electrode cross each other at the pixel area, and the electron emission region is located on the cathode at the pixel area.

19. The display device of claim 18, wherein the cathode and the gate electrode comprise a transparent or semi-transparent conducting material, and the insulation layer comprises a transparent or semi-transparent insulating material.

* * * * *